United States Patent [19]

Koike

[11] 4,390,803
[45] Jun. 28, 1983

[54] SEMICONDUCTOR DRIVER CIRCUIT

[75] Inventor: Hideharu Koike, Chigasaki, Japan

[73] Assignee: Tokyo Shibaura Denki Kabushiki Kaisha, Kawasaki, Japan

[21] Appl. No.: 218,094

[22] Filed: Dec. 19, 1980

[30] Foreign Application Priority Data

Dec. 27, 1979 [JP] Japan .............................. 54/171656

[51] Int. Cl.³ ..................... H03K 17/687; H03K 3/01
[52] U.S. Cl. .................................... 307/578; 307/270; 307/571
[58] Field of Search ................ 307/578, 270, 297, 571

[56] References Cited

U.S. PATENT DOCUMENTS

| 3,946,245 | 3/1976 | McClaughry | 307/270 |
| 4,048,632 | 9/1977 | Spence | 307/578 |
| 4,284,905 | 8/1981 | Rosenweig | 307/270 |

*Primary Examiner*—Stanley D. Miller
*Assistant Examiner*—B. P. Davis
*Attorney, Agent, or Firm*—Finnegan, Henderson, Farabow, Garrett & Dunner

[57] ABSTRACT

Disclosed is a semiconductor driver circuit which includes first and second switching MOS transistors, a series circuit of first and second MOS transistors connected between the first switching MOS transistor and a power supply terminal, a third MOS transistor connected between the second switching MOS transistor and the power supply terminal, a load capacitor adapted to be connected between the drain and source of the second MOS switching transistor, and a capacitor circuit connected between the gate and source of the third MOS transistor. The capacitor circuit includes first and second capacitors connected in series with each other, and the junction of the first and second capacitors is coupled to the drain of the first switching MOS transistor. This driver circuit further includes a third switching MOS transistor whose gate is connected with the gates of the first and second switching MOS transistors, whose source is connected with the drain of the first switching MOS transistor, and whose drain is connected with the gates of the second and third MOS transistors, and a fourth MOS transistor whose source is connected with the drain of the third switching MOS transistor and whose drain and gate are coupled to the power supply terminal.

6 Claims, 3 Drawing Figures

SEMICONDUCTOR DRIVER CIRCUIT

BACKGROUND OF THE INVENTION

This invention relates to a semiconductor driver circuit formed of MOS transistors and other elements.

Conventionally known is a driver circuit having a bootstrap circuit as shown in FIG. 1, for example. The driver circuit of FIG. 1 includes switching MOS transistors 2 and 4 whose gates are both connected with an input terminal $V_{IN}$ and whose sources are grounded; an enhancement-type MOS transistor 6 and a depletion-type MOS transistor 8 whose current paths are connected in series between a power supply terminal $V_D$ and with the drain of the MOS transistor 2 and a D-type MOS transistor 10 connected between the power supply terminal $V_D$ and the drain of the MOS transistor 4. The gate of the MOS transistor 6 is connected to the power supply terminal $V_D$, and the gates of the MOS transistors 8 and 10 are both connected with the drain of the MOS transistor 2. The driver circuit further includes a capacitor 12 connected in parallel with the current path of the MOS transistor 4, and a capacitor 14 connected between the gate and source of the MOS transistor 10. An output terminal $V_{OUT}$ of the driver circuit is coupled with the drain of the MOS transistor 4.

Assume now that a high-level voltage is applied to the input terminal $V_{IN}$. In this case, the MOS transistors 2 and 4 are turned on to allow current to flow through the MOS transistors 6, 8 and 2 as well as through the MOS transistors 10 and 4, and capacitors 12 and 14 are kept in a discharged state. Subsequently, when a low-level voltage is applied to the input terminal $V_{IN}$, the MOS transistors 2 and 4 are turned off, and the capacitors 12 and 14 are charged through the MOS transistors 6 and 8. In this case, if the capacitor 12 has a capacitance greater enough than that of the capacitor 14, the voltage across the capacitor 14 becomes ($V_D - V_T$) (here $V_T$ is the threshold voltage of the MOS transistor 6). As the charging voltage of the capacitor 14, i.e. the gate voltage of the MOS transistor 10 increases, the resistance of the MOS transistor 10 is reduced, so that the capacitor 12 is charged more quickly through the MOS transistor 10.

The charging voltage of the capacitor 14 or the gate voltage of the MOS transistor 10 is further boosted by a bootstrap action of the capacitor 12. As a result, the resistance of the MOS transistor 10 is further reduced, and finally the capacitor 12 is charged up to the supply voltage $V_D$, and the gate voltage of the MOS transistor 10 becomes $(2 V_D - V_T)$.

In an actual driver circuit, however, leakage current flows through the MOS transistors 2 and 4 in the non-conductive state, so that the gate potential of the MOS transistor 10 can be increased to only about $(3/2 V_D - V_T)$ at the most. Accordingly, the conductive resistance of the MOS transistor 10 cannot be made small enough. When the high-level input voltage is applied to the input terminal $V_{IN}$, moreover, relatively large power consumption may be caused by current flowing through the MOS transistor 10.

SUMMARY OF THE INVENTION

An object of this invention is to provide a semiconductor driver circuit capable of reliable high-speed operation and consuming little power.

In an aspect of this invention, there is provided a semiconductor driver circuit comprising first and second MOS transistors having their gates connected with an input terminal and one ends of their current paths connected with a first power supply terminal, a series circuit of first resistive means and a third MOS transistor connected between the other end of the current path of the first MOS transistor and a second power supply terminal, second resistive means, one end of which is connected with the second power supply terminal, a fourth MOS transistor whose current path is connected between the other end of the second resistive means and the other end of the current path of the first MOS transistor and whose gate is connected with the input terminal, first capacitive mean one end of which is connected with the gate of the third MOS transistor and the other end of the second resistive means and the other end of which is connected with the other end of the current path of the first MOS transistor, a fifth MOS transistor whose current path is connected between the second power supply terminal and the other end of the current path of the second MOS transistor and whose gate is connected with the one end of the first capacitive means, second capacitive means connected between the other end of the first capacitive means and the other end of the current path of the second MOS transistor, and third capacitive means connected between the other end of the second capacitive means and the first power supply termianl.

When a low-level input signal is applied to the driver circuit, for example, the first capacitive means is charged to a voltage substantially three times as high as the voltage between the first and second power supply terminal, causing the third capacitive means to be securely quickly charged to a voltage which is applied to the second power supply terminal.

DETAILED DESCRIPTION OF THE PREFERRED EMBODIMENT

Figure 1:
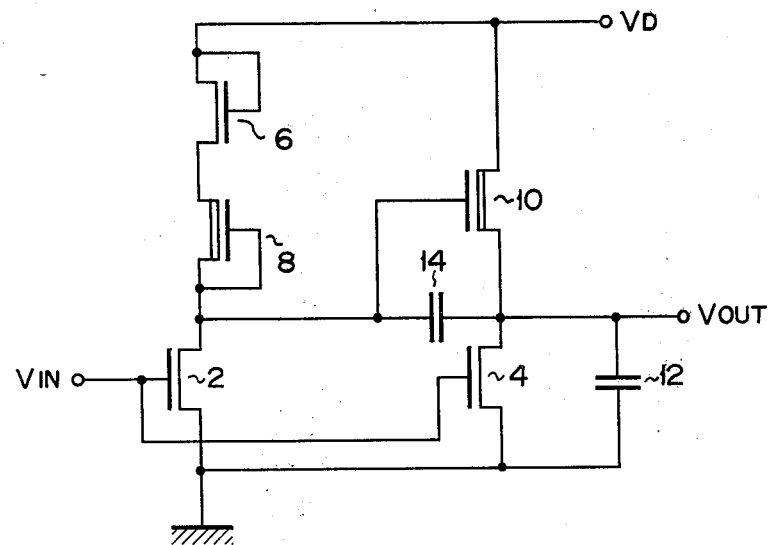
FIG. 1 is a circuit diagram of a prior art semiconductor driver circuit.
Figure 2:
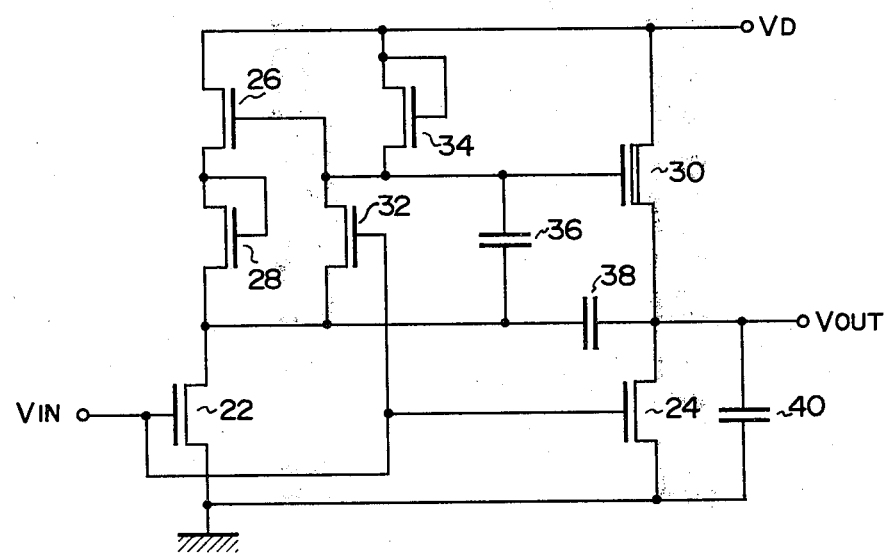
FIG. 2 is a circuit diagram of a semiconductor driver circuit according to an embodiment of this invention.

FIG. 2 shows a semiconductor driver circuit according to an embodiment of this invention which is composed of N-channel MOS transistors. This driver circuit includes: E-type MOS transistors 22 and 24 whose gates are connected to an input terminal $V_{IN}$ and whose sources are grounded; an E-type MOS transistor 26 whose drain is connected to a power supply terminal $V_D$; an E-type MOS transistor 28 whose gate and drain are connected to the source of the MOS transistor 26 and whose source is connected to the drain of the MOS transistor 22; a D-type MOS transistor 30 whose drain is connected to the power supply terminal $V_D$, whose source is connected to the drain of the MOS transistor 24, and whose gate is connected to the gate of the MOS transistor 26; and an E-type MOS transistor 32 whose drain is connected to the gates of the MOS transistors 26 and 30, whose source is connected to the drain of the MOS transistor 22, and whose gate is connected to the input terminal $V_{IN}$. The driver circuit further includes: an E-type MOS transistor 34 whose drain and gate are connected to the power supply terminal $V_D$ and whose source is connected to the drain of the MOS transistor 32; a capacitor 36 having one end connected to the source of the MOS transistor 34 and the other end connected to the drain of the MOS transistor 22; a capacitor 38 connected between the other end of the capacitor 36 and the drain of the MOS transistor 24; and a capacitor 40 connected between the drain and source of the MOS transistor 24. An output terminal $V_{OUT}$ of the driver circuit is connected to the drain of the MOS transistor 24.

In the driver circuit shown in FIG. 2, when a high-level input signal is applied to the input terminal $V_{IN}$, the MOS trnsistors 22, 24 and 32 are turned on. As a result, the capacitor 36 is discharged through the MOS transistors 32 and 22, and the capacitors 38 and 40 are discharged through the MOS transistors 22 and 24, respectively. At this time, the MOS transistor 26 is in the nonconductive state, so that current flows through the MOS transistors 34, 32 and 22 as well as through the MOS transistors 30 and 24, and the capacitors 36, 38 and 40 are kept in the discharged state. Subsequently, when a low-level signal is applied to the input terminal $V_{IN}$, the MOS transistors 22, 24 and 32 are turned off, and the capacitors 36, 38 and 40 are charged through the MOS transistor 34. Thus, a voltage V1 finally appearing across the capacitor 36 may be given by $$V1 = (V_D - V_{TH}) \times \frac{C2}{C1 + C2 + \frac{C1 \cdot C2}{C3}} \quad (1)$$

where $V_D$ is the supply voltage, $V_{TH}$ is the threshold voltage of the MOS transistor 34, and C1, C2 and C3 are the capacitances of the capacitors 36, 38 and 40, respectively.

If we have C3>>C2>C1, the charging voltage V1 is given by $$V1 = V_D - V_{TH} \quad (2)$$

When the voltage across the capacitor 36 becomes greater than 2 $V_{TH}$ as the capacitors 36, 38 and 40 are charged, the MOS transistor 26 is turned on. As a result, the capacitors 38 and 40 are charged with current flowing through the MOS transistors 26 and 28. Accordingly, the final voltage V2 across the capacitor 38 is given by $$V2 = (V_D - V_{TH}) \times \frac{C3}{C2 + C3} \quad (3)$$

where the MOS transistor 28 also has a threshold voltage $V_{TH}$.

Since there is a relation C3>>C2 as aforesaid, the charging voltage V2 of the capacitor 38 may be given as follows:

$$V2 = V_D - V_{TH} \quad (4)$$

As the voltages across the capacitors 36 and 38 increase, the gate-source voltage of the load MOS transistor 30 increases to reduce the resistance of the MOS transistor 30. Thus, the capacitor 40 is charged through the MOS transistor 30, and the potential at the output terminal $V_{OUT}$ finally increases up to the supply voltage $V_D$. As a result, the finally obtained gate potential $V_G$ of the MOS transistor 30 may be given by $$V_G = V1 + V2 + V_D = 3 V_D - 2 V_{TH} \quad (5)$$

Thus, when the capacitors 36, 38 and 40 are charged, the gate voltage of the MOS transistor 30 is quickly increased to the voltage level (3 $V_D - 2 V_{TH}$) by a bootstrap action of the capacitors 38 and 40, so that the capacitor 40 is rapidly charged to the voltage level $V_D$ through the MOS transistor 30.

Subsequently, when the high-level input signal is applied to the input terminal $V_{IN}$, the switching transistors 22, 24 and 32 are turned on, and the capacitors 36, 38 and 40 are discharged to turn off the MOS transistor 26. Accordingly, current flows through the MOS transistors 34, 32 and 22 as well as through the MOS transistors 30 and 24. Since the MOS transistor 34 is intended to charge the capacitor 36 with an extremely small capacitance, an MOS transistor with small driving capability can be used for the MOS transistor 34. Namely, the current flowing through the MOS transistor 34 is small when the high-level input signal is applied to the input terminal $V_{IN}$. Therefore, the power consumption in the driver circuit in this state may largely depend on the current flowing through the MOS transistor 30. Since zero-volt voltage is applied to the gate of the MOS transistor 30 in this state, the dimensions and threshold voltage of the MOS transistor 30 may suitably be determined so as to minimize the current flowing through the MOS transistor 30. By setting the threshold voltage of the MOS transistor 30 to 0 V, for example, the current flowing through the MOS transistor 30 can be minimized when the high-level input voltage is applied.

Figure 3:
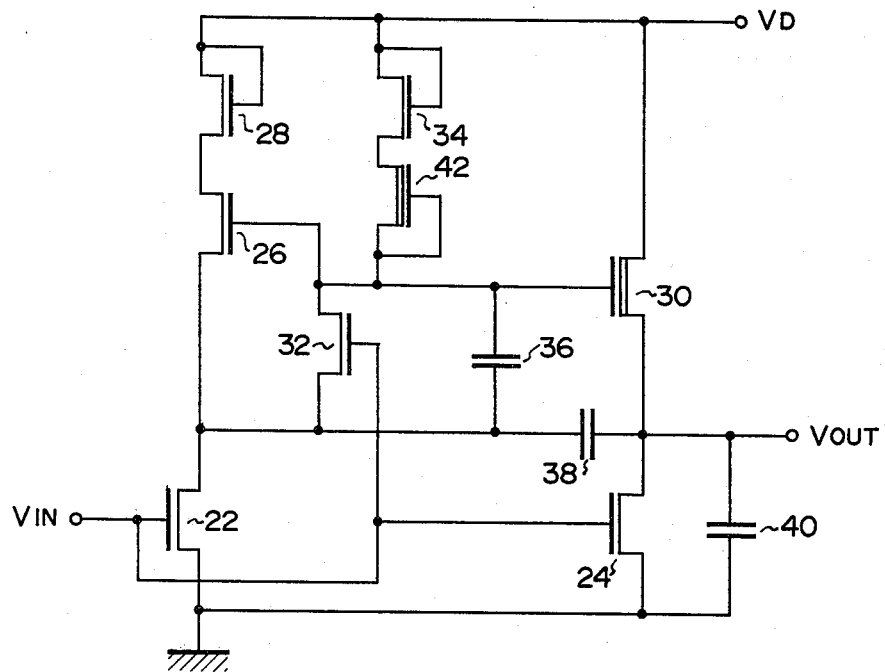
FIG. 3 is a circuit diagram showing a modification of the semiconductor driver circuit of FIG. 2.

Although an illustrative embodiment of this invention has been described in detail herein, the invention is not limited to such embodiment. As shown in FIG. 3, for example, a D-type MOS transistor 42 may be connected in series with the MOS transistor 34, and the sequence of connection of the MOS transistors 26 and 28 may be changed. Further, P-channel MOS transistors may be substituted for the N-channel MOS transistors, or an E-type MOS transistor may be used in place of the D-type MOS transistor 30.

What is claimed is:

1. A semiconductor driver circuit comprising:
an input terminal;
a power supply terminal;
a first switching MOS transistor having a gate connected to said input terminal;
a second switching MOS transistor having a gate connected to said input terminal, a load capacitor being adapted to be connected in parallel with a current path of said second switching MOS transistor;
a series circuit of first and second MOS transistors connected between said power supply terminal and said first switching MOS transistor;
a third MOS transistor connected between said power supply terminal and said second switching MOS transistor;
a third switching MOS transistor whose current path is connected at one end to a junction between said first switching MOS transistor and said series circuit of first and second MOS transistors, and at the other end to the gates of said second and third MOS transistors, and whose gate is connected to said input terminal;

a series circuit of first and second capacitive means connected between the gate and source of said third MOS transistor, a junction between said first and second capacitive means being coupled with a junction between said first and third switching MOS transistors; and a fourth MOS transistor whose source is to be connected with said load capacitor through said first and second capacitive means and whose gate and drain are connected with said power supply terminal.

2. A driver circuit according to claim 1, wherein one end of said first capacitive means is connected with the gate of said third MOS transistor, and said first capacitive means has a capacitance smaller than that of said second capacitive means.

3. A driver circuit according to claim 1 or 2, wherein the drain of said second MOS transistor is connected with said power supply terminal, and the drain and gate of said first MOS transistor are connected with the source of said second MOS transistor.

4. A driver circuit according to claim 1 or 2, wherein the gate and drain of said first MOS transistor are connected with said power supply terminal, and the drain of said second MOS transistor is connected with the source of said first MOS transistor.

5. A driver circuit according to claim 1 or 2, further comprising a fifth MOS transistor of a depletion type whose gate and source are connected with each other, said fifth MOS transistor being connected in series with said fourth MOS transistor.

6. A driver circuit according to claim 1 or 2, wherein said third MOS transistor is of a depletion type.

* * * * *